United States Patent
Sonde et al.

(10) Patent No.: US 11,725,300 B2
(45) Date of Patent: Aug. 15, 2023

(54) IN-SITU LASER ANNEALING OF TE GROWTH DEFECTS IN CDZNTE (ILAST-CZT)

(71) Applicants: Sushant Sonde, Westmont, IL (US); Yong Chang, Naperville, IL (US); Silviu Velicu, Naperville, IL (US)

(72) Inventors: Sushant Sonde, Westmont, IL (US); Yong Chang, Naperville, IL (US); Silviu Velicu, Naperville, IL (US)

(73) Assignee: EPIR, INC., Bolingbrook, IL (US)

( * ) Notice: Subject to any disclaimer, the term of this patent is extended or adjusted under 35 U.S.C. 154(b) by 0 days.

(21) Appl. No.: 17/838,956

(22) Filed: Jun. 13, 2022

(65) Prior Publication Data

US 2023/0002928 A1 Jan. 5, 2023

Related U.S. Application Data

(60) Provisional application No. 63/210,054, filed on Jun. 13, 2021.

(51) Int. Cl.
*C30B 19/10* (2006.01)
*C30B 29/46* (2006.01)
*C30B 30/00* (2006.01)

(52) U.S. Cl.
CPC .............. *C30B 19/10* (2013.01); *C30B 29/46* (2013.01); *C30B 30/00* (2013.01)

(58) Field of Classification Search
CPC .......... C30B 19/10; C30B 29/46; C30B 30/00
See application file for complete search history.

(56) References Cited

U.S. PATENT DOCUMENTS

| | | | | |
|---|---|---|---|---|
| 4,946,544 A | * | 8/1990 | Ejim | C30B 11/00 117/953 |
| 8,101,019 B2 | * | 1/2012 | Sahr | C30B 29/06 117/37 |
| 9,493,888 B2 | * | 11/2016 | Skelton | C30B 11/006 |
| 9,664,448 B2 | * | 5/2017 | Stoddard | C01B 33/037 |
| 2009/0158993 A1 | * | 6/2009 | Sahr | C30B 11/04 117/73 |
| 2013/0255318 A1 | * | 10/2013 | Hussy | F27B 14/20 65/84 |
| 2014/0027430 A1 | * | 1/2014 | Stoddard | F27D 3/1518 219/158 |
| 2015/0086464 A1 | * | 3/2015 | Turchetti | C30B 11/006 117/83 |

FOREIGN PATENT DOCUMENTS

DE 19580737 * 2/2002

* cited by examiner

*Primary Examiner* — Robert M Kunemund
(74) *Attorney, Agent, or Firm* — Erickson Law Group, PC

(57) ABSTRACT

In a crystal growth furnace having an array of vertically arranged heaters to provide controlled heating zones within a chamber, and a crucible for holding crystal material, wherein the crystal is grown vertically through the heating zones, the improvement includes a laser mounted outside the chamber which radiates a beam of energy to locally melt precipitates and inclusions. The furnace includes a mechanism to position the laser vertically to, at or near the interface between the formed crystal and crystal melt material above the formed crystal. The crystal material can be CdZnTe.

11 Claims, 1 Drawing Sheet

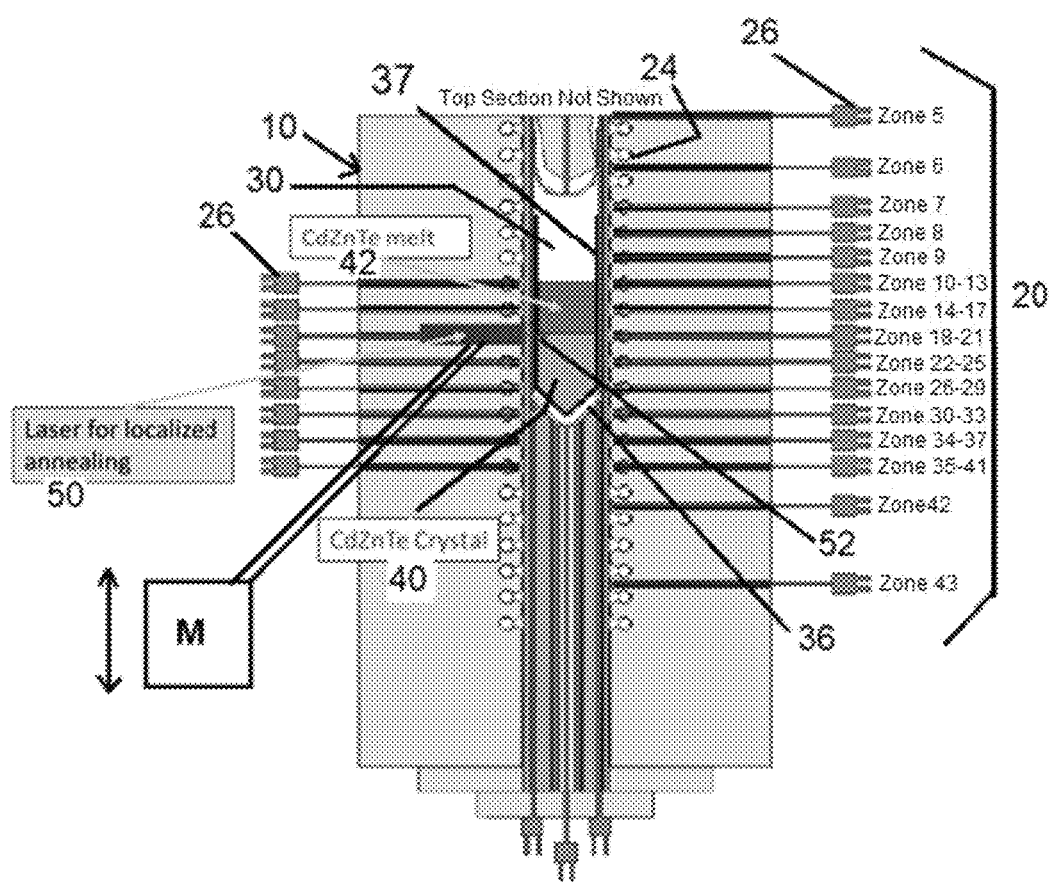

IN-SITU LASER ANNEALING OF TE GROWTH DEFECTS IN CDZNTE (ILAST-CZT)

This application claims the benefit of U.S. Ser. No. 63/210,054, filed Jun. 13, 2021.

BACKGROUND

A large density of Tellurium (Te) precipitates is difficult to avoid in as-grown CdZnTe (CZT) boules (a single-crystal ingot produced by synthetic means) because there is a large deviation from stoichiometry at the growth temperature. As the CZT is cooled to room temperature, the excess Te forms precipitates from <1 to ~25 µm in size. Many attempts have been made to eliminate these precipitates, yet they remain a problem. As the CZT is cooled to room temperature dislocation clusters, Te precipitates, and surface crater or void defects in epilayers grown on the substrates can occur. The voids can short p-n junctions and hence blind pixels in Focal Plane Arrays (FPAs).

The Te precipitates also give rise to high hole concentrations in Mercury Cadmium Telluride (HgCdTe) (or "MCT") layers grown by liquid phase epitaxy (LPE). When nonstoichiometric CdZnTe is cooled rapidly from high temperature, the grown crystals include precipitates. In order to reduce the Te precipitates, wafer annealing of CdZnTe containing Te precipitates, over the temperature range 500-900° C., using Cd/Zn pressures appropriate to stoichiometry, still led to an increase in dislocation density and rocking-curve width in X-Ray diffraction characterization. Under typical melt-growth conditions, CZT is grown from a melt that is slightly tellurium rich, thus leading to excess Te at growth temperatures and CZT that is supersaturated with tellurium upon cooldown. Tellurium-rich, second-phase particles form under the action of this unfavorable thermodynamic condition.

What is still puzzling, however, is the very large size of these particles in CZT, seemingly too large to be explained by simple solid-state nucleation growth mechanisms. It is postulated that such Te precipitates may never be eliminated owing to their thermodynamic origin.

Different post-growth annealing treatments have been proposed to eliminate Te inclusions. Thermal treatments under Cd-pressure, Te-pressure, or evaporating CdZn alloy powders were proposed. Two-step annealing (the first in Cd vapors, the second in Te-vapors) demonstrated to be effective in order to preserve the material high resistivity. During this kind of annealing, when the sample experienced a temperature gradient during the heat treatment, it was shown that Te inclusions thermo-migrate towards the high temperature region. This happens due to the increasing solubility of CdZnTe in liquid Te with temperature. However, in spite of the efforts, the ideal post-growth thermal treatment, capable of eliminating Te inclusions, keeping electrical resistivity very high, and at the same time improving substrate quality is still missing. This is also because, during the heat treatment, impurities segregated inside Te inclusions are dissolved in the crystal matrix and, in general, a different defect equilibrium is obtained, with strong consequences on material resistivity and carrier traps. An alternative approach reported in literature to eliminate Te inclusions was instead based on the thermo-migration of Te impurities under the presence of a pulsed laser source.

At the employed wavelength (10.2 µm from a $CO_2$ laser source) not only CdZnTe crystals are transparent but also Te inclusion absorption is low. For these reasons the sample was heated at 300° C. Laser-induced thermo-migration was observed in that case, but the movement of Te inclusions was low (3 µm/h at most). Later, it has been shown that by means of a pulsed laser at 1.064 µm it is instead possible to eliminate Te inclusions at room temperature, avoiding high temperature processes that can modify the defect equilibrium in CdZnTe crystals. The mechanism is driven by the strong absorption of the light by tellurium inclusions. The amount of energy transferred to the system is compatible with the proposed thermo-diffusion mechanism. Even if it was not possible to obtain thermo-diffusion of largest inclusions (over 10 µm in diameter), calculations however showed that by using laser pulses of longer duration (100 ns) it is possible to melt and make diffuse also large tellurium inclusions without damaging the sample surface.

SUMMARY

An apparatus and method are disclosed to remove the Te precipitates and Te inclusions by localized in-situ annealing by an appropriate laser mounted on the CZT growth furnace.

A general-purpose crystal growth furnace can be used for growth of CdZnTe crystals. This furnace is based on an apparatus such as disclosed in U.S. Pat. No. 6,562,134, herein incorporated by reference. A multizone heating scheme is used. The temperature profile is precisely varied by controlling each heater individually. Neither a crucible nor the furnace move during crystal growth.

The laser is mounted on to the furnace and by radiating a beam across the growing crystal at or near the interface between the grown crystal portion and a melt portion of the crystal material will help melting any Te precipitates or inclusions formed in the crystal during growth, by localized annealing. A mechanism is provided, such as a linear positioning mechanism, to raise the laser vertically as the crystal is grown, to radiate the crystal at or near the rising interface between the formed crystal and the crystal melt material. The mechanism can be a precise positioning device such as a piezo drive, a stepper motor, a linear actuator, a motorized screw drive, or the like.

The Te precipitates and Te inclusions are locally heated at the crystal-melt interface or close to crystal-melt interface to induce thermo-migration of Te impurities. Since this is done in-situ and close to the crystal-melt interface during the growth of CZT crystal, the defects left behind by migration of Te impurities due to localized laser annealing can be healed, thus improving the crystal quality of the grown CZT crystal and improving the overall CZT crystal growth yield. Additionally, there may be unintended nucleation at the crucible-melt interface during growth. Also, interaction between the growth interface and the ampoule wall may give rise to multiple grains in the CZT crystals, thus lowering the yield. The apparatus and method of the present invention using the laser for localized annealing will reduce or eliminate any unwanted nucleation sites at the ampoule walls thus lowering the possibility of forming multiple grains.

In a crystal growth furnace having an array of vertically arranged heaters to provide controlled heating zones within a chamber, and a crucible for holding crystal material, wherein the crystal is grown vertically through the heating zones, the improvement comprises a laser mounted outside the chamber which radiates a beam of energy to locally melt precipitates and inclusions. The furnace includes a mechanism to position the laser vertically to at or near the interface between the formed crystal and crystal melt material above the formed crystal. The crystal material can be CdZnTe.

Numerous other advantages and features of the present invention will be become readily apparent from the following detailed description of the invention and the embodiments thereof, and from the accompanying drawings.

BRIEF DESCRIPTION OF THE DRAWINGS

FIG. 1 is a schematic sectional view of a crystal growth furnace incorporating an embodiment of the present invention.

DETAILED DESCRIPTION

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

This application incorporates by reference U.S. Ser. No. 63/210,054, filed Jun. 13, 2021.

FIG. 1 illustrates a general-purpose crystal growth furnace 10 used for growth of CdZnTe crystals. This furnace is based on an apparatus such as disclosed in U.S. Pat. No. 6,562,134, herein incorporated by reference. The furnace includes a vertical array of heaters 20 comprising individual annular heaters 24 each having one or more electrical connections 26 to independently control each heater. A single CdZnTe crystal 40 is grown vertically on an ampoule 36 within a chamber 30 of a crucible 37. Above the crystal 40 is the melted portion 42 to be grown on the solid crystal portion 40 as it cools by precise control of the heaters 24. The temperature profile is precisely varied by controlling each heater individually. Neither crucible nor the furnace move during growth.

According to an exemplary embodiment of the present invention a laser 50 is mounted on the outside of the chamber 30. The laser 50 radiates a beam 52 across the crystal 40 to melt any Te precipitates or inclusions formed during growth, by localized annealing. The crucible is transparent to the laser beam. A vertical control mechanism "M" (shown schematically) moves the laser vertically to position the laser precisely for localized annealing, such as at or near the interface between the CdZnTe crystal 40 and the CdZnTe melt 42 as the crystal is grown. The mechanism "M" can be a precise positioning device such as a piezo drive, a linear actuator, a fine screw motor, a stepper motor, or the like.

The Te precipitates and Te inclusions are locally heated by the laser 50 at the crystal-melt interface or close to crystal-melt interface to induce thermo-migration of Te impurities. Since this is done in-situ and close to the crystal-melt interface during the growth of CZT crystal, the defects left behind by migration of Te impurities due to localized laser annealing can be healed, thus improving the crystal quality of grown CZT crystal and improve the overall CZT crystal growth yield. Additionally, there may be unintended nucleation at the crucible-melt interface during growth. Also, interaction between the growth interface and the ampoule wall gives rise to multiple grains in the CZT crystals, thus lowering the yield. The exemplary embodiment utilizing the laser for localized annealing will reduce any unwanted nucleation sites at the ampoule walls thus lowering the possibility of forming multiple grains.

From the foregoing, it will be observed that numerous variations and modifications may be effected without departing from the spirit and scope of the invention. It is to be understood that no limitation with respect to the specific apparatus illustrated herein is intended or should be inferred.

The invention claimed is:

1. In a crystal growth furnace having an array of vertically arranged heaters to provide controlled heating zones within a chamber, and a crucible for holding crystal material, wherein the crystal is grown vertically through the heating zones, the improvement comprising:
    a laser mounted outside the chamber that radiates a beam of energy to locally melt precipitates and inclusions.

2. The improvement according to claim 1, comprising a mechanism to position the laser vertically to radiate the crystal to, at or near the interface between the formed crystal and crystal melt material above the formed crystal.

3. The improvement according to claim 1, wherein the crystal material comprises CdZnTe.

4. A method of growing crystals in a crystal growth furnace having an array of vertically arranged heaters to provide controlled heating zones within a chamber, and a crucible for holding crystal material, including the steps of:
    growing the crystal vertically through the heating zones; and
    radiating a beam of energy to locally melt precipitates and inclusions.

5. The method according to claim 4, comprising the step of positioning a laser vertically to radiate said beam of energy to, at or near the interface between the formed crystal and crystal melt material above the formed crystal and using the laser to radiate said beam of energy.

6. The method according to claim 4, wherein the crystal material comprises CdZnTe.

7. The method according to claim 6, wherein the crystal material comprises CdZnTe.

8. A method of growing crystals in a crystal growth furnace having heating zones and a crucible for holding crystal material, including the steps of:
    growing the crystal vertically through the heating zones; and
    radiating a beam of energy to locally melt precipitates and inclusions.

9. The method according to claim 8, comprising the step of positioning a laser vertically to radiate said beam of energy to, at or near the interface between the formed crystal and crystal melt material above the formed crystal.

10. The method according to claim 9, wherein the crystal material comprises CdZnTe.

11. The method according to claim 8, wherein the crystal material comprises CdZnTe.

* * * * *